United States Patent
Chou et al.

(10) Patent No.: US 11,816,411 B2
(45) Date of Patent: Nov. 14, 2023

(54) METHOD AND SYSTEM FOR SEMICONDUCTOR WAFER DEFECT REVIEW

(71) Applicant: Taiwan Semiconductor Manufacturing Co., Ltd., Hsinchu (TW)

(72) Inventors: Chung-Pin Chou, Hsinchu (TW); Chun-Wen Wang, Hsinchu (TW); Meng Ku Chi, Hsinchu (TW); Yan-Cheng Chen, Hsinchu (TW); Jun-Xiu Liu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 371 days.

(21) Appl. No.: 17/103,772

(22) Filed: Nov. 24, 2020

(65) Prior Publication Data

US 2021/0232745 A1 Jul. 29, 2021

Related U.S. Application Data

(60) Provisional application No. 62/967,473, filed on Jan. 29, 2020.

(51) Int. Cl.
| | |
|---|---|
| *G06F 30/367* | (2020.01) |
| *G06N 20/00* | (2019.01) |
| *G06N 5/04* | (2023.01) |
| *G06T 7/70* | (2017.01) |
| *G06T 7/00* | (2017.01) |

(52) U.S. Cl.
CPC ............ *G06F 30/367* (2020.01); *G06N 5/04* (2013.01); *G06N 20/00* (2019.01); *G06T 7/001* (2013.01); *G06T 7/70* (2017.01); *G06T 2207/10061* (2013.01); *G06T 2207/20081* (2013.01); *G06T 2207/30148* (2013.01)

(58) Field of Classification Search
CPC .... G06F 30/367; G06F 30/392; G06F 18/214; G06N 5/04; G06N 20/00; G06N 3/045; G06N 3/08; G06T 7/001; G06T 7/70; G06T 2207/10061; G06T 2207/20081; G06T 2207/30148; G06T 2207/20084; G06T 7/0002; G06V 10/25
See application file for complete search history.

(56) References Cited

U.S. PATENT DOCUMENTS

| | | | |
|---|---|---|---|
| 6,578,188 B1 * | 6/2003 | Pang | ......................... G03F 1/26 977/839 |
| 8,607,169 B2 | 12/2013 | Leu | |
| 10,831,976 B1 * | 11/2020 | Sha | ........................ G06N 20/00 |

(Continued)

FOREIGN PATENT DOCUMENTS

| | | |
|---|---|---|
| TW | 201245852 A1 | 11/2012 |
| TW | I498853 B | 9/2015 |

*Primary Examiner* — Stacy Whitmore
(74) *Attorney, Agent, or Firm* — SEED IP LAW GROUP

(57) ABSTRACT

A semiconductor wafer defect detection system captures test images of a semiconductor wafer. The system analyzes the test images with an analysis model trained with a machine learning process. The analysis model generates simulated integrated circuit layouts based on the test images. The system detects defects in the semiconductor wafer by comparing the simulated integrated circuit layouts to reference integrated circuit layouts.

20 Claims, 6 Drawing Sheets

(56) References Cited

U.S. PATENT DOCUMENTS

| | | |
|---|---|---|
| 2003/0228049 A1 | 12/2003 | Asai |
| 2012/0198404 A1 | 8/2012 | Hasebe |
| 2017/0193400 A1* | 7/2017 | Bhaskar .................. G06N 3/08 |
| 2017/0364798 A1* | 12/2017 | Karlinsky .............. G06N 3/045 |
| 2018/0300434 A1* | 10/2018 | Hu ...................... G03F 7/70441 |
| 2020/0174380 A1* | 6/2020 | Huang ...................... G03F 1/36 |
| 2021/0027984 A1* | 1/2021 | Chou .................... H01J 37/261 |
| 2021/0383530 A1* | 12/2021 | Peleg .................... G06N 3/045 |
| 2022/0277136 A1* | 9/2022 | Shekhar ............... G06F 18/211 |

* cited by examiner

METHOD AND SYSTEM FOR SEMICONDUCTOR WAFER DEFECT REVIEW

BACKGROUND

Technical Field

The present disclosure relates to the field of semiconductor processing. The present disclosure relates more particularly to detecting defects in semiconductor wafers during semiconductor processing.

Description of the Related Art

Fabrication of integrated circuits is typically accomplished by performing a large number of processing steps on semiconductor wafers. The processing steps typically result in the formation of a large number of transistors in highly complex arrangements in conjunction with a semiconductor substrate. The processing steps also result in the formation of dielectric layers, metal interconnects, vias, plugs, and other integrated circuit structures and components.

During processing of a semiconductor wafer, it is often beneficial to perform defect reviews between processing steps. However, many of the features formed on semiconductor wafers are very small. Detecting defects in these very small features can be very difficult. Performing defect reviews can be very costly in terms of time and resources. Furthermore, due to the difficulty in detecting defects, many defects may not be detected during the defect review process. This can lead to poorly functioning or nonfunctioning integrated circuits when processing of the wafer is complete.

BRIEF SUMMARY

DETAILED DESCRIPTION

Figure 1:
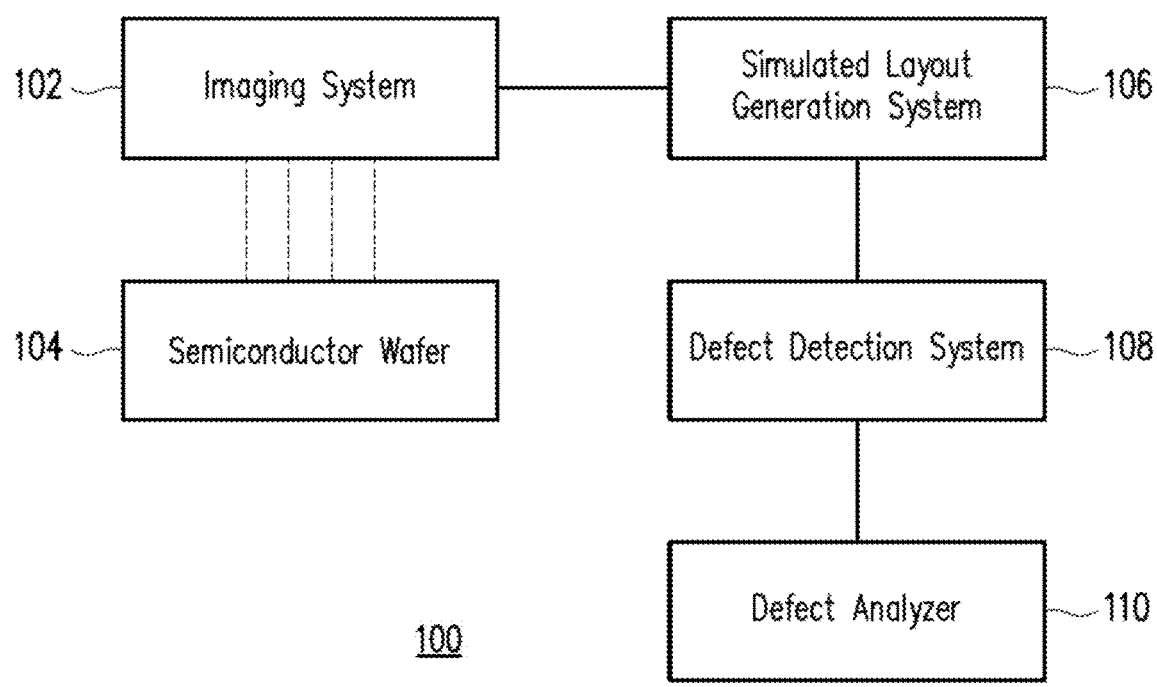
FIG. 1 is a block diagram of a semiconductor wafer defect detection system, according to one embodiment.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide simpler, more effective, and less expensive defect review of semiconductor wafers. Embodiments of the present disclosure capture images of a semiconductor wafer under review. Embodiments of the present disclosure analyze the images and utilize machine learning processes to generate integrated circuit layouts for the semiconductor wafer under review based on the images. Embodiments of the present disclosure compare the simulated integrated circuit layouts to reference integrated circuit layouts associated with a reference semiconductor wafer. Defects in the wafer under review are easily and accurately identified by identifying differences in the simulated integrated circuit layouts and the reference integrated circuit layouts. The defect review process is simple, effective, and relatively inexpensive in terms of time and resources. Accordingly, embodiments of the present disclosure resulted in semiconductor wafers with fewer defects because defects in processing are identified and corrected.

FIG. 1 is a block diagram of a semiconductor wafer defect review system 100, according to an embodiment. The semiconductor wafer defect review system 100 includes an imaging system 102, a simulated layout generation system 106, a defect locator 108, and a defect analyzer 110. The components of the semiconductor wafer defect review system 100 cooperate to identify and analyze defects in a semiconductor wafer 104.

In one embodiment, the imaging system 102 is configured to generate images of the semiconductor wafer 104. The imaging system 102 can capture images of the semiconductor wafer 104 between semiconductor processing steps. The images captured by the imaging system 102 can be utilized to identify defects in the semiconductor wafer 104.

The semiconductor wafer defect review system 100 can be part of a semiconductor processing system. The semiconductor processing system performs a large number of semiconductor processes on the semiconductor wafer 104. The semiconductor processes can include photolithography processes, etching processes, thin-film deposition processes, planarization processes, doping processes, annealing processes, and other types of processes.

In one embodiment, after one or more of these processes has been performed, it can be beneficial to inspect the semiconductor wafer 104 for defects. This can help ensure that the one or more foregoing processes have accomplished their intended purpose. If there are defects, then the processes, or parameters associated with the processes, may need to be adjusted in order to ensure that there are no defects in the future. If there are no defects, then the processes are functioning properly.

In one example, a series of semiconductor processes forms metal lines on a dielectric substrate. Accordingly, the semiconductor processes may include forming a dielectric substrate on the semiconductor wafer 104 with a thin film deposition process, forming a metal layer on top of the dielectric substrate with a second thin-film deposition process, and depositing and patterning a hard mask on the metal layer. The semiconductor processes may further include etching the metal layer in the presence of the patterned hard mask, thereby forming metal lines from the metal layer. The metal lines have the pattern of the hard mask. The hard mask is then removed, leaving the metal lines.

In this example, the pattern of the metal lines is defined by a previously generated integrated circuit layout. One example of an integrated circuit layout is a simulated graphic database system (GDS) layout, though other types or formats of layouts can be used. The integrated circuit layout defines a mask pattern for the metal lines. After an integrated circuit layout has been generated utilizing one or more specialized software programs for generating layouts for semiconductor processing, a photolithography mask can be generated in accordance with the layout. The integrated circuit layout generally has sharp, clearly distinct features. The semiconductor wafer review system 100 utilizes the nature of the layout masks to assist in identifying defects, as will be described in more detail below.

Continuing with the example of metal lines, after the metal lines have been formed, the semiconductor wafer 104 is brought to the imaging system 102 to initiate a defect review process. The imaging system 102 captures a plurality of images of the semiconductor wafer 104. Each region of the semiconductor wafer 104 is captured by at least one of the images. Each region of the semiconductor wafer 104 may be captured in multiple images. The images can include images of varying resolution. For example, a particular region of the semiconductor wafer 104 may be imaged with a first resolution level. Various subregions of that region may then be imaged with a second, higher level of resolution in order to zoom in on areas of interest as will be described in more detail below.

In one embodiment, the imaging system 102 passes the images to the simulated layout generation system 106. The simulated layout generation system 106 analyzes the images and generates, for each image, a simulated integrated circuit layout. The simulated integrated circuit layout is, in one embodiment, a GDS layout. The simulated integrated circuit layout is a simulation of a layout having a pattern that would result in the structures or features captured in the image. The simulated integrated circuit layout can be utilized to identify defects in the semiconductor wafer 104.

Returning to the example in which metal lines have been formed on the semiconductor wafer 104, after the simulated layout generation system 106 has generated a simulated integrated circuit layout for each image, the simulated layout generation system 106 passes the simulated images to the defect locator 108. The defect locator 108 retrieves, for each simulated integrated circuit layout, a reference integrated circuit layout. The reference integrated circuit layout corresponds to the actual layout used to generate the features for the region of the semiconductor wafer 104.

After the defect locator 108 has retrieved a reference image for each simulated image, the defect locator 108 identifies defects in the images of the semiconductor wafer 104 by comparing the simulated integrated circuit layouts to the corresponding reference integrated circuit layouts. Areas in which a simulated integrated circuit layout is different from a reference integrated circuit layout correspond to areas of defect. Thus, the defect locator 108 can quickly identify areas of defect in an image by identifying differences between simulated integrated circuit layouts and their corresponding reference integrated circuit layouts.

Because the simulated integrated circuit layouts and the reference integrated circuit layouts have sharp, clearly distinct features, any differences between a simulated integrated circuit layout and its corresponding reference integrated circuit layout will be easily noticeable in a comparison. Thus, the defect locator 108 can quickly and reliably identify areas of defect by comparing simulated integrated circuit layouts to reference integrated circuit layouts.

In one embodiment, after the defect locator 108 identifies areas of defect, the images, as well as the information identifying areas of defect, are passed to the defect analyzer 110. The defect analyzer 110 can focus on or zoom in on the areas of defect in the images generated by the imaging system 102. The defect analyzer 110 can enable technicians to quickly zoom in on and focus on relevant areas in the images in order to determine the nature of the defects and the possible causes of the defects. In one embodiment, the imaging system 102 can generate higher resolution images of defective areas after the defect locator 108 has identified areas of defect.

In one embodiment, the imaging system 102 can include an electron microscope. The imaging system 102 generates electron microscope images of the various regions of the semiconductor wafer 104. The electron microscope images can then be passed to the simulated layout generation system 106. Alternatively, the imaging system 102 can include other types of imaging systems. The other types of imaging systems can include optical imaging systems, atomic force microscope imaging systems, or other types of imaging systems without departing from the scope of the present disclosure.

Figure 2:
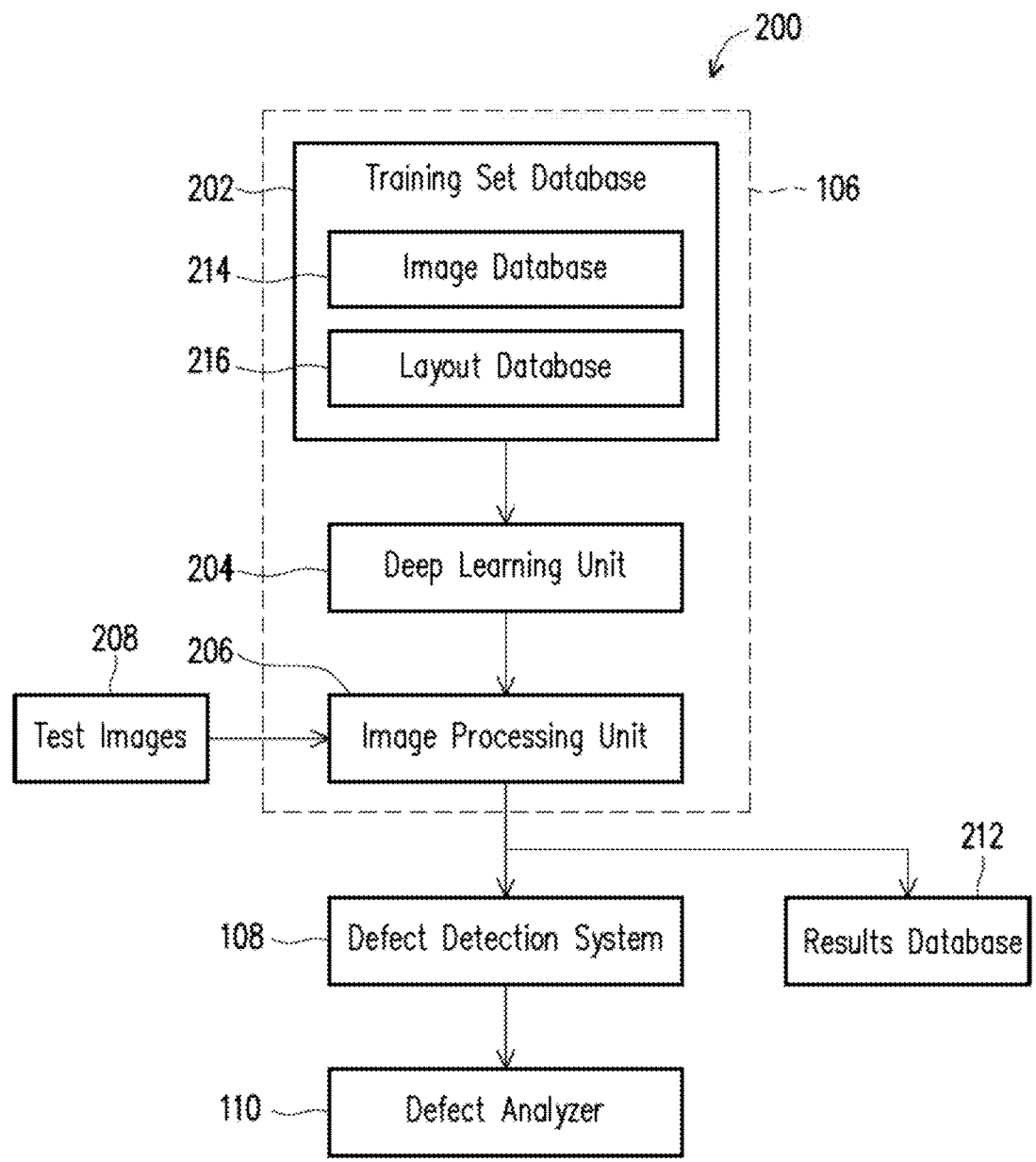
FIG. 2 is a block diagram of a semiconductor wafer defect detection system, according to one embodiment.

FIG. 2 is a block diagram of a portion of a defect review system 200, according to an embodiment. The system 200 includes a training set data base 202, a deep learning unit 204, an image processing unit 206, a defect detection system 210, and a results database 212. The components of the defect review system 200 assist in detecting defects in semiconductor wafers.

In one embodiment, the training set data base 202 includes an image data base 214. The image data base 214 stores a plurality of images of one or more semiconductor wafers after particular stages of semiconductor processing. For example, if the system 200 is utilized to detect defects after formation of metal lines in metal 1, then the image data base 214 can include images of various regions of a semiconductor wafer after formation of metal lines in metal 1. The images of the various regions of the semiconductor wafer are utilized in a machine learning process, as will be described in more detail below.

In one embodiment, the training set data base 202 includes a layout database. The layout database includes a plurality of integrated circuit layouts. Each integrated circuit layout in the layout database 216 corresponds to the layout for a particular area or region of the semiconductor wafer. More particularly, each layout corresponds to a region of the semiconductor wafer captured in a respective image from the image data base 214. Accordingly, each layout from the layout database 216 is linked to an image from the image data base 214. Alternatively, multiple layouts may be associated with a single image, or multiple images may be associated with a single layout.

In one embodiment, the images from the image data base and the layouts from the layout database 216 correspond to labeled training set data. The data items of the training set include images from the image database 214 and layouts from layout database 216. The labels identify which layout from the layout database 216 or layouts correspond to each image from the image database 214.

The deep learning unit 204 utilizes the training set data from the training set data base 202 to perform a deep learning process. In particular, the deep learning unit 204 undergoes a machine learning process that utilizes the training set to train the deep learning unit 204 to reproduce layouts based on images of semiconductor wafers. In other words, the deep learning unit utilizes the training set to learn how to generate a layout that matches the patterns in an image of a semiconductor wafer.

In one embodiment the deep learning unit 204 trains an analysis model, such as a neural network. During the training process, the neural network receives, as input, images of the semiconductor wafers from the image database 214. During the training process, the neural network outputs a layout for each image based on a set of internal functions. The internal functions are based on weighting values associated with neurons of each neural layer of the neural network. During training, the deep learning unit 204 compares each layout generated by the neural network to the layout that was used to fabricate the portion of the wafer in the image. The deep learning unit 204 generates an error function indicating how closely the layout generated by the neural network matches the actual layout. The deep learning unit 204 then adjusts the internal functions of the neural network. Because the neural network generates layouts based on the internal functions, adjusting the internal functions will result in the generation of different layouts for a same image. Adjusting the internal functions can result in generated layouts that produce larger error functions (worse matching to the actual layouts) or smaller error functions (better matching to the actual layouts). After adjusting the internal functions of the neural network, the images are again passed to the neural network and layouts are generated and compared to the actual layouts. The deep learning unit 204 again adjusts the internal functions of the neural network. This process is repeated in a very large number of iterations of tracking error functions and adjusting the internal functions of the neural network until a set of internal functions is found that results in simulated layouts that match the actual layouts.

At the beginning of the training process, the generated layouts likely will not match the actual layouts very closely. However, as the training process proceeds through many iterations of adjusting the internal functions of the neural network, the errors functions will trend smaller and smaller until a set of internal functions is found that results in generated layouts that match the actual layouts. Identification of a set of internal functions that results in matching layouts corresponds to completion of the training process. Once the training process is complete, the neural network is ready to be used to detect flaws in wafers.

In one embodiment, the deep learning unit 204 utilizes a convolutional neural network model. The convolutional neural network model includes multiple layers of neurons. Image data is received in the form of tensors input to the convolutional neural network. A first convolutional layer of neurons processes the image data in accordance with weighing functions and parameters associated with the neurons of the first layer. In particular, the first layer performs convolution operations on the tensors. The result is a series of tensors of reduced dimensions. These tensors of reduced dimensions are then passed to a second convolutional neural layer. The second convolutional neural layer performs convolution operations on the tensors received from the first convolutional neural layer. Eventually the tensors are passed to one or more fully connected layers. The fully connected layers perform a classification for each area of the image. The result of the classifications is a GDS type layout in which each area of the image has been converted into a portion of a layout. A layout corresponding to the image is generated by stitching together the various portions of the layouts output from the final fully connected layer. As described above, the training process trains the convolutional neural network to generate, for each image, a layout that matches the actual layout used to generate the features captured in the image by adjusting the functions associated with each neural layer of the convolutional neural network. The deep learning unit 204 can include models or algorithms other than a convolutional neural network without departing from the scope of the present disclosure.

In one embodiment, after the analysis model or algorithm has been trained by the deep learning unit 204, the analysis model or algorithm is imported into the image processing unit 206. The image processing unit 206 is able to generate simulated integrated circuit layouts utilizing the model or algorithm generated by the deep learning unit 204.

In one embodiment, the image processing unit 206 receives test images 208. The test images 208 correspond to images of a semiconductor wafer 104 by an imaging system 102, as described in relation to FIG. 1. The test images 208 are generated for the purpose of determining whether there are defects in the semiconductor wafer 104.

In one embodiment, the image processing unit 206 generates, for each test image 208, a respective simulated integrated circuit layout. The image processing unit 206 generates the simulated integrated circuit layout in accordance with the algorithm or model generated by the deep learning unit 204. The simulated integrated circuit layout generated by the image processing unit 206 corresponds to a predicted layout that would result in the features shown in the test image 208. The image processing unit 206 can generate simulated integrated circuit layouts for a large number of test images 208 received from the imaging system 102. The simulated integrated circuit layouts are then passed to the defect detection system 210 and the results database 212.

In one embodiment, the defect detection system 210 determines whether there are defects in the semiconductor wafer 104. The defect detection system 210 determines whether there are defects by analyzing the simulated integrated circuit layouts that were generated based on the images of the semiconductor wafer 104. The simulated integrated circuit layouts, can provide an indication of the presence of defects in the semiconductor wafer 104.

In one embodiment, the defect detection system 210 identifies defects by comparing the simulated integrated circuit layouts to reference integrated circuit layouts. In particular, the defect detection system 210 compares each simulated integrated circuit layout to a corresponding reference integrated circuit layout. If there are areas in the simulated integrated circuit layout that are different than the reference integrated circuit layout, then this is an indication that there are defects in the semiconductor wafer 104 at the locations corresponding to the areas of difference in the simulated integrated circuit layout.

In one embodiment, the defect detection system 210 compares the simulated integrated circuit layout to the reference integrated circuit layout by performing an image subtraction operation in which the simulated integrated circuit layout is subtracted from the reference integrated circuit layout, or vice versa. The result of the subtraction is a layout that that highlights those areas where there are differences between the simulated integrated circuit layout and the reference integrated circuit layout. If the reference integrated circuit layout and the simulated integrated circuit layouts are identical, then the resulting layout will be blank. If the simulated integrated circuit layout and the reference integrated circuit layout are not identical, then there will be indicators on the subtraction layout at locations corresponding to the locations where the simulated integrated circuit layout is different from the reference integrated circuit layout.

In one embodiment, the defect detection system 210 records the location of defects. The defect detection system 210 can map the location of the defect as indicated on the subtraction image to a location on the semiconductor wafer 104. This is because the imaging system that captures the test images 208 records location information for each test image 208. The location information indicates the area of the semiconductor wafer 104 that is captured in each test image 208. This information is provided to the defect detection system 210. Because each simulated integrated circuit layout is based on a test image, a defect location indicated by the simulated integrated circuit layout, or the subtraction layout generated from the simulated integrated circuit layout and the reference integrated circuit layout, can be mapped to a location on a test image 208 which is in turn mapped to a location of the semiconductor wafer 104.

In one embodiment, after the defect location has been detected, the defect location information is passed to the defect analyzer 213. The defect analyzer 213 can receive the test image 208 and the defect location coordinates on the test image 208. The defect analyzer 213 can assist in analyzing the defect.

In one embodiment, the defect analyzer 213 zooms in on the location of the defect in a test image 208. The defect analyzer 213 can then display an enlarged view of the defect for review by an expert. The expert or experts can determine a probable cause of the defect based on analysis of the defect site presented by the defect analyzer 213.

In one embodiment, the defect analyzer 213 can analyze the defect location utilizing defect analysis tools. The defect analysis tools can include analysis models and other software applications that can analyze aspects of the test image. The defect analysis tools can provide indications regarding the cause of the defects.

In one embodiment, after the defect detection system 210 has detected a defect, the imaging system 102 can automatically capture new images of the defect location. The new images can include high-resolution images of the defect location on the semiconductor wafer 104. The new high-resolution images can be provided to the defect analyzer 213 for review by experts and/or software systems.

In one embodiment, the results database 212 stores the simulated integrated circuit layouts. After the image processing unit 206 generates simulated integrated circuit layouts, the simulated integrated circuit layouts can be provided to the results database 212 for storage. In one embodiment, the defect detection system 210 can also provide defect location data, subtracted layouts, and test images 208.

Figure 3:
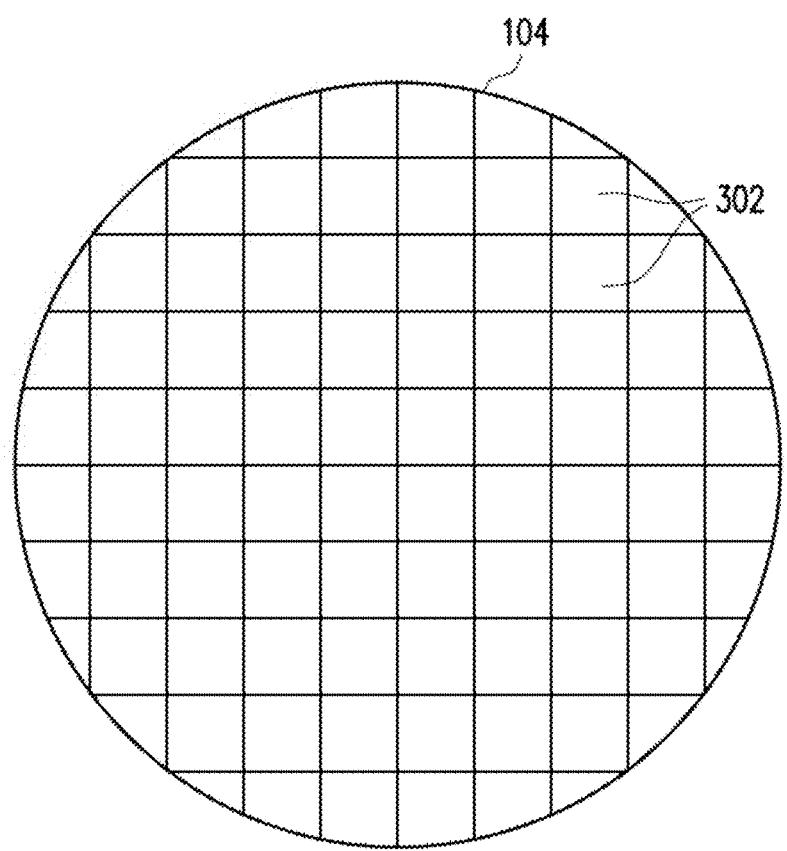
FIG. 3 is an illustration of a semiconductor wafer, according to one embodiment.

FIG. 3 is an illustration of a semiconductor wafer 104, according to one embodiment. The illustration of FIG. 3 shows that the semiconductor wafer 104 is divided into a plurality of regions 302. The imaging system 102 can capture test images 208 of each region 302. Alternatively, imaging system 102 may capture test images 208 of only selected regions 302. In practice, the semiconductor wafer 104 may include a much larger number of regions 302 than shown in FIG. 3. Each test image 208 may capture a region 302 less than 1 $\mu m^2$ in area. Test images 208 may capture other sizes of area without departing from the scope of the present disclosure.

Figure 4:
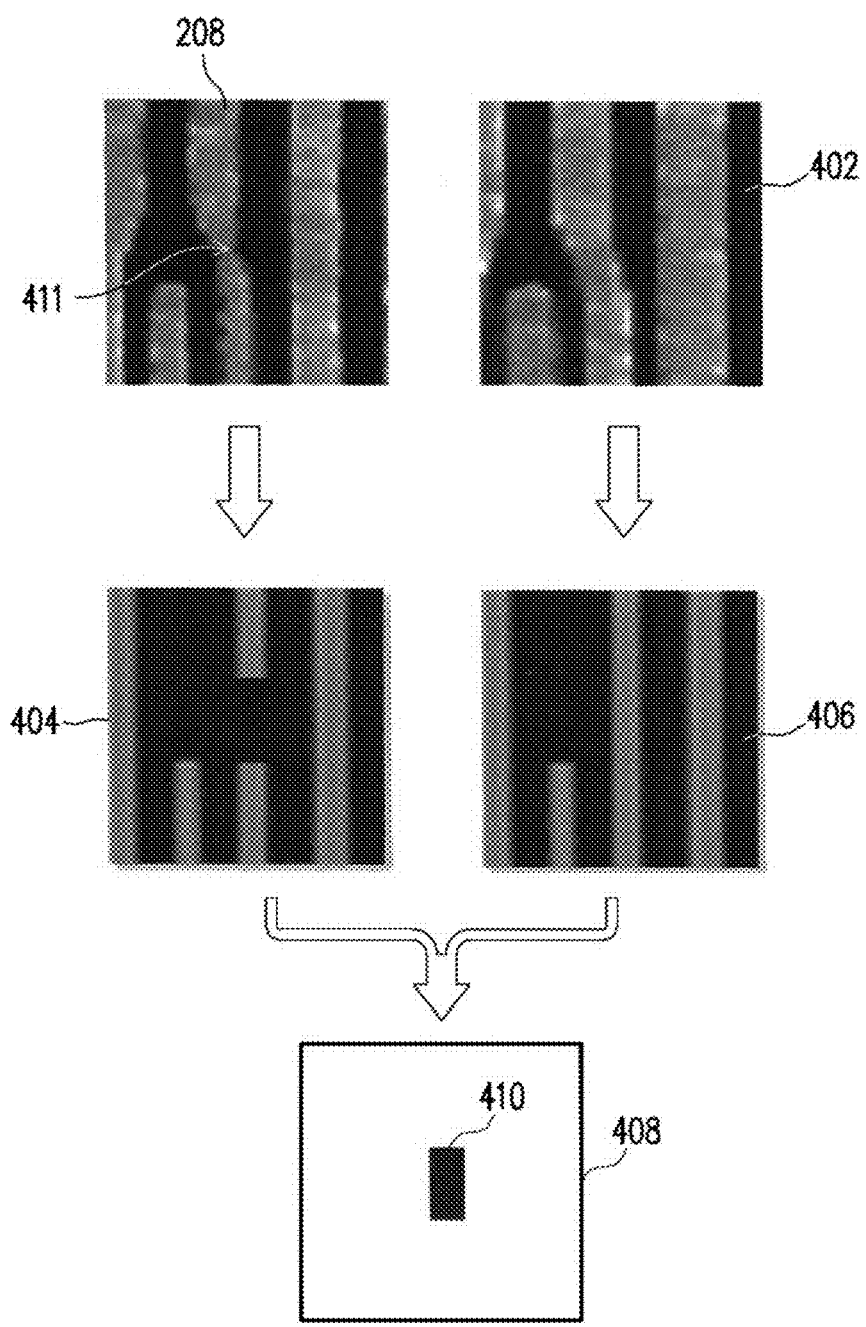
FIG. 4 illustrates semiconductor wafer images and layouts, according to one embodiment.

FIG. 4 illustrates a plurality of layouts and images for identifying defects in a semiconductor wafer 104, according to one embodiment. FIG. 4 illustrates a test image 208, a reference image 402, a simulated integrated circuit layout 404, a reference integrated circuit layout 406, and a difference layout 408. The various images and layouts are utilized to detect defects in a semiconductor wafer 104.

In one embodiment, the test image 208 is an image of a region 302 of a semiconductor wafer 104. The test image 208 may be captured after one or more semiconductor processes has been performed on the semiconductor wafer 104. The test image 208 can be an electron microscope image, an optical image, an x-ray scattering image, or other types of images.

In one embodiment, the reference image 402 is an image of a reference semiconductor wafer. The reference image 402 corresponds to a same region of the reference semiconductor wafer as the test image 208 captures of the semiconductor wafer 104. In practice, the reference semiconductor wafer is known to not have defects. Accordingly, the reference image 402 does not include defects. Instead, the reference image 402 shows what the features of the test image 208 should look like if properly formed.

In one embodiment, the simulated integrated circuit layout 404 is generated from the test image 208 by an image processing unit, such as the image processing unit 206 of FIG. 2. As described in relation to FIG. 2 above, the image processing unit 206 processes the test image 208 with a deep learning algorithm and generates a simulated integrated circuit layout 404 that would result in the features of the test image 208. As can be seen in FIG. 4, the reference integrated circuit layout includes sharp, clearly defined features. This is in contrast to the test image 208 that has features that are less distinct.

The reference integrated circuit layout 406 is the layout that is utilized to generate the features and the reference image 402. Layouts such as the reference integrated circuit layout 406 are generated using software programs. The layouts show the positions and shapes of features to be formed on a semiconductor wafer. The layouts are utilized to generate photolithography masks for patterning the features on the semiconductor wafer. The reference integrated circuit layout 406 shows a very small portion of an overall layout for features to be formed on a semiconductor wafer in a particular stage of processing. In one embodiment, the reference integrated circuit layout 406 is a GDS layout, though other types of layouts may be utilized without departing from the scope of the present disclosure.

In one embodiment, the difference layout 408 is generated from the simulated integrated circuit layout 404 and the reference integrated circuit layout 406. The difference layout 408 corresponds to the difference between the reference integrated circuit layout 406 and the simulated integrated circuit layout 404. If a feature is present at a particular location in the reference integrated circuit layout 406, but not present in that location of the simulated integrated circuit layout 404, then the difference image will contain a difference feature. In other embodiments, if a feature is not present at a particular location in the reference integrated circuit layout 406, but is present in that location of the simulated integrated circuit layout 404, then the difference image will contain a difference feature.

In the example of FIG. 4, the difference layout 408 is blank at all locations except at a difference location 410. The difference location 410 is black, clearly indicating the area of difference between the simulated integrated circuit layout 404 and the reference integrated circuit layout 406. The difference location 410 corresponds to a defect location 411 in the test image 208.

The generation of the simulated integrated circuit layout 404 greatly assists in detecting defects in the semiconductor wafer 104. Detecting defects based on a direct comparison between the test image 208 and the reference image 402 can be very difficult. This is due to the fact that the test image 208 and the reference image 402 include high levels of detail, curved features, and slight differences in coloration or grayscale. Because there may be small differences throughout the test image 208 and the reference image 402, the effects are difficult to detect. The simulated integrated circuit layout 404 and the reference integrated circuit layout 406 have only binary coloration and sharp, clearly defined features. Differences between the simulated integrated circuit layout 404 and the reference integrated circuit layout 406 are very simple to detect.

Figure 5:
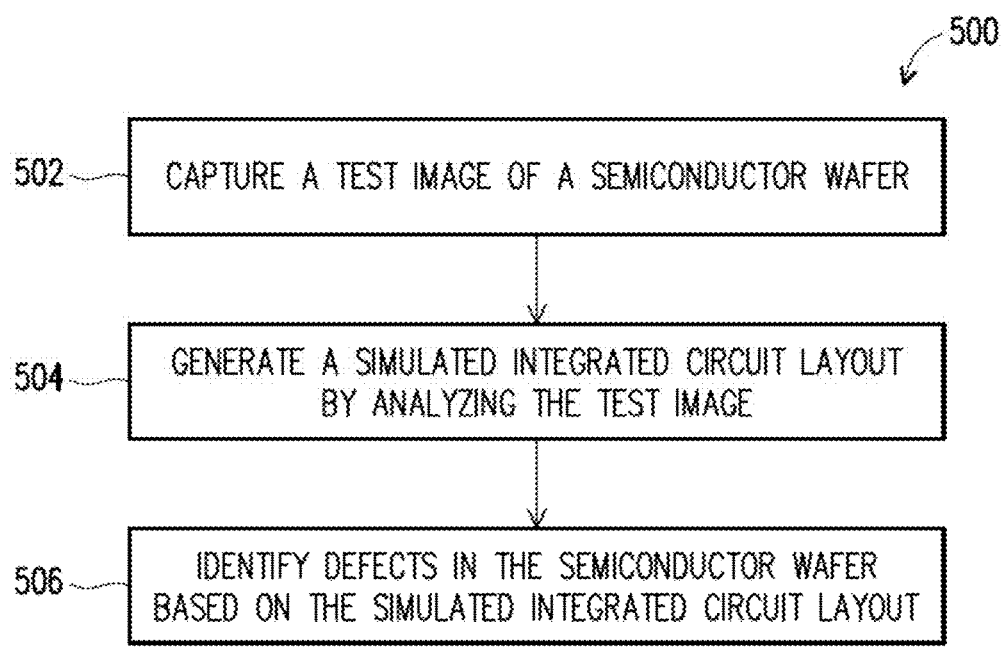
FIG. 5 is a flow diagram of a method for detecting defects in a semiconductor wafer, according to one embodiment.

FIG. 5 is a flow diagram of a method 500 for detecting defects in a semiconductor wafer, according to one embodiment. At 502, the method 500 includes capturing a test image of a semiconductor wafer. One example of a semiconductor wafer is the semiconductor wafer 104 of FIG. 3. One example of a test image is the test image 208 of FIG. 4. At 504, the method 500 includes generating a simulated integrated circuit layout by analyzing the test image. One example of a simulated integrated circuit layout is the simulated integrated layout 404 of FIG. 4. At 506, the method 500 includes identifying defects in the semiconductor wafer based on the simulated integrated circuit layout.

Figure 6:
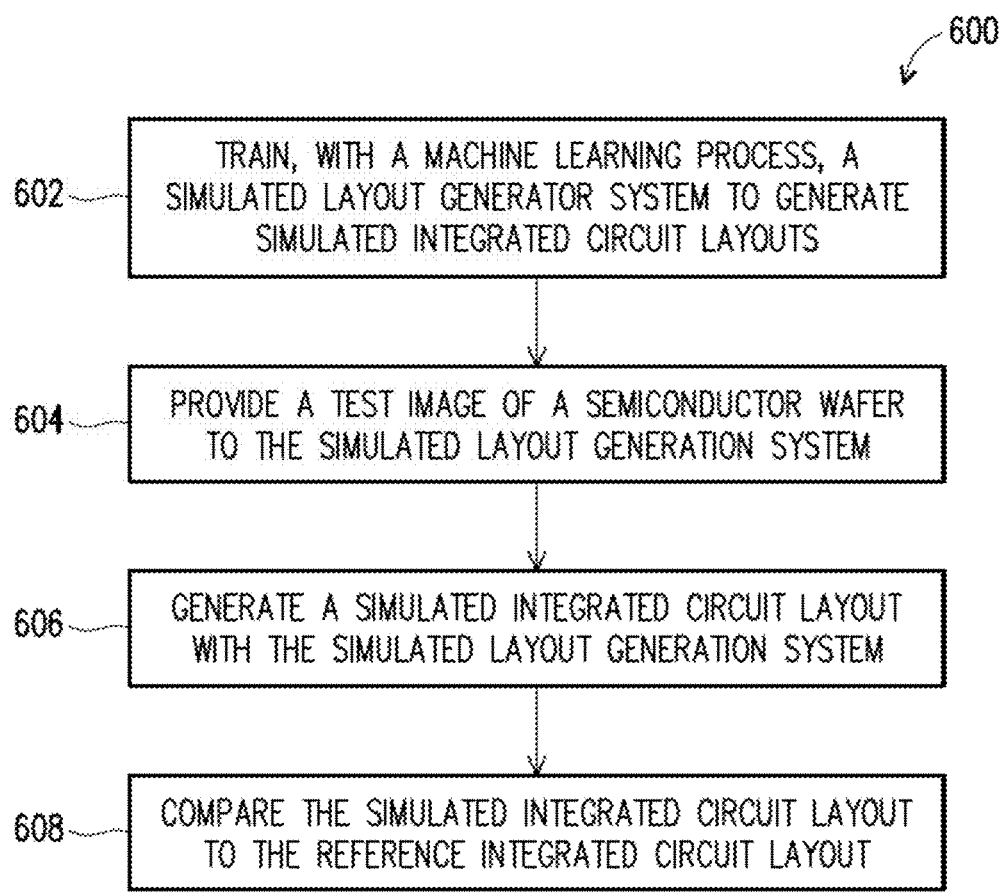
FIG. 6 is a flow diagram of a method for detecting defects in a semiconductor wafer, according to one embodiment.

FIG. 6 is a flow diagram of a method 600 for detecting defects in a semiconductor wafer, according to one embodiment. At 602, the method 600 includes training, with a machine learning process, a simulated layout generator to generate simulated integrated circuit layouts. One example of a simulated layout generator is the simulated layout generator 106 of FIG. 1. At 604, the method 600 includes providing a test image of a semiconductor wafer to the simulated layout generation system. One example of a test image is the test image 208 of FIG. 4. At 606, the method 600 includes generating a simulated integrated circuit layout with the simulated layout generation system. One example of a simulated integrated circuit layout is the simulated integrated circuit layout 404 of FIG. 4. At 608, the method 600 includes comparing the simulated integrated circuit layout to the reference integrated circuit layout.

One embodiment is a method including capturing a test image of a semiconductor wafer. The method includes generating a simulated integrated circuit layout by analyzing the test image identifying defects in the semiconductor wafer based on the simulated integrated circuit layout.

One embodiment is a method including training, with a machine learning process, a simulated layout generation system to generate simulated integrated circuit layouts and providing a test image of a semiconductor wafer to the simulated layout generation system. The method includes generating a simulated integrated circuit layout with the simulated layout generation system and comparing the simulated integrated circuit layout to the reference integrated circuit layout.

One embodiment is a system including a simulated layout generation system configured to receive a test image of a semiconductor wafer and to generate a simulated integrated circuit layout based on the test image. The system includes a defect detection system configured to compare the simulated integrated circuit layout to a reference integrated circuit layout and to detect a defect in the semiconductor wafer based on a difference between the simulated integrated circuit layout and the reference integrated circuit layout.

The various embodiments described above can be combined to provide further embodiments. Aspects of the embodiments can be modified, if necessary, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
capturing a test image of a semiconductor wafer;
generating a simulated integrated circuit layout by analyzing the test image;
generating a reference image of a reference semiconductor wafer;
generating a reference layout based on the reference image;
comparing the simulated integrated circuit layout to the reference layout; and
identifying defects in the semiconductor wafer based on comparing the simulated integrated circuit layout to the reference layout.

2. The method of claim 1, wherein comparing the simulated integrated circuit layout to the reference integrated circuit layout includes generating a difference layout corresponding to a difference between the reference integrated circuit layout and the simulated integrated circuit layout.

3. The method of claim 2, wherein identifying defects in the semiconductor wafer includes identifying difference locations in the difference layout.

4. The method of claim 1, wherein the reference integrated circuit layout is a layout utilized for generating a photolithography mask for semiconductor processing.

5. The method of claim 1, further comprising generating the simulated integrated circuit layout with an image processing system.

6. The method of claim 5, further comprising training, with a machine learning process, the image processing system to generate simulated integrated circuit layouts based on test images.

7. The method of claim 6, wherein the machine learning process includes utilizing a labeled training set including training images and training layouts.

8. The method of claim 7, wherein the training images are images of one or more reference semiconductor wafers, wherein the training layouts are layouts associated with processing the one or more reference semiconductor wafers.

9. A method, comprising:
training, with a machine learning process, a simulated layout generation system to generate simulated integrated circuit layouts;
providing a test image of a semiconductor wafer to the simulated layout generation system;
generating a simulated integrated circuit layout with the simulated layout generation system;
generating a reference image of a reference semiconductor wafer;
generating a reference layout based on the reference image; and
comparing the simulated integrated circuit layout to a reference integrated circuit layout.

10. The method of claim 9, further comprising detecting a defect in the semiconductor wafer based on differences between the simulated integrated circuit layout and the reference integrated circuit layout.

11. The method of claim 9, wherein training the simulated layout generator includes training the simulated layout to generate, for a plurality of training images, simulated integrated circuit layouts that match training integrated circuit layouts.

12. A system, comprising:
a simulated layout generation system configured to:
receive a test image of a semiconductor wafer;
generate a simulated integrated circuit layout based on the test image;
receive a reference image of a reference semiconductor wafer; and
generate a reference layout based on the reference semiconductor wafer; and
a defect detection system configured to compare the simulated integrated circuit layout to a reference integrated circuit layout and to detect a defect in the semiconductor wafer based on a difference between the simulated integrated circuit layout and the reference integrated circuit layout.

13. The system of claim 12, further comprising an imaging system configured to capture the test image by imaging the semiconductor wafer.

14. The system of claim 13, wherein the imaging system includes one or more of:
an electron microscope;
a bright field optical imaging system; and
a dark field optical imaging system.

15. The system of claim 12, wherein the simulated layout generation system includes a deep learning unit configured to learn, via one or more machine learning processes, an algorithm for generating simulated integrated circuit layouts based on test images.

16. The system of claim 15, further comprising an image processing unit configured to implement the algorithm.

17. The system of claim 16, wherein the image processing unit is configured to process the test image and generate the simulated integrated circuit layout with the algorithm.

18. The system of claim 17, wherein the simulated layout generation system includes a training set database including training set data for training the deep learning unit.

19. The system of claim 18, wherein the training set database includes:
an image database including training images of the training set data; and
a layout database including training layouts of the training set data.

20. The system of claim 19, wherein the training images are images of one or more reference semiconductor wafers, wherein the training layouts are layouts associated with processing the one or more reference semiconductor wafers.

* * * * *